United States Patent [19]

Aitken

[11] 4,314,857
[45] Feb. 9, 1982

[54] METHOD OF MAKING INTEGRATED CMOS AND CTD BY SELECTIVE IMPLANTATION

[75] Inventor: Alan Aitken, Cowansville, Canada

[73] Assignee: Mitel Corporation, Kanata, Canada

[21] Appl. No.: 92,609

[22] Filed: Nov. 8, 1979

[30] Foreign Application Priority Data

Jul. 31, 1979 [CA] Canada ................................. 332884

[51] Int. Cl.³ .................... H01L 21/263; H01L 7/54; H01L 27/04
[52] U.S. Cl. .................................. 148/1.5; 148/187; 357/24; 357/42; 357/91
[58] Field of Search ................. 148/1.5, 187; 357/24, 357/42, 91

[56] References Cited

U.S. PATENT DOCUMENTS

| | | | |
|---|---|---|---|
| 3,865,652 | 2/1975 | Augusta et al. | 148/187 |
| 3,868,274 | 2/1975 | Hobar et al. | 148/1.5 |
| 3,897,282 | 7/1975 | White | 148/175 |
| 4,013,484 | 3/1977 | Boleky et al. | 148/175 |
| 4,046,606 | 9/1977 | Lambert | 148/187 |
| 4,052,229 | 10/1977 | Pashley | 148/1.5 |
| 4,115,796 | 9/1978 | Fujimoto et al. | 357/42 |
| 4,217,149 | 8/1980 | Sawazaki | 148/1.5 |

*Primary Examiner*—Upendra Roy
*Attorney, Agent, or Firm*—Alan H. Levine

[57] ABSTRACT

A method of forming combination CMOS field effect transistors optionally with a charge transfer device in a single substrate. Different resistivities in the P type wells of the substrate are formed by a combination of masks; a high energy low dosage ion implantation of impurity passes through one mask but not the other, and a low energy high dosage ion implantation of the impurity is stopped by both masks. A significant number of fabrication steps is thus saved, and the devices so fabricated are threshold and field voltage compatible.

13 Claims, 8 Drawing Figures

METHOD OF MAKING INTEGRATED CMOS AND CTD BY SELECTIVE IMPLANTATION

BACKGROUND OF THE INVENTION

This invention relates to apparatus and methods of fabricating integrated circuits and particularly to apparatus and methods of fabricating CMOS devices having resistivity in their field regions different than in their channel regions, and CMOS devices combined with a charge transfer device on the same substrate with the resistivities of the active regions of the CMOS and charge transfer devices being optimized and different.

DESCRIPTION OF THE PRIOR ART

Charge coupled device (CTD) structures have been utilized as shift registers, photosensitive devices, etc. The basic theory and operation of these types of devices are described in the *Bell System Technical Journal*, April 1970, page 587, in an article by Boyle and Smith entitled "Charged-Coupled Semiconductor Devices", and also in the same publication, page 593 in an article by Amelio et al entitled "Experimental Varification Of The Charged-Coupled Device Concept".

A method of fabrication of self-aligned charge coupled elements is described in Canadian Pat. No. 1,027,672 issued Mar. 7, 1978 to Michael P. Anthony et al. The invention of self aligned MOS and charge coupled structures has allowed the fabrication of smaller (and thus faster) devices with fewer processing steps than before.

While CTD elements have been manufactured in individual integrated circuit chips, it is desirable to be able to integrate field effect transistors with them whereby input-output circuitry and other signal processing circuitry could be combined on the same substrate. A structure of this kind has been described in Canadian Pat. No. 976,661 issued Oct. 21, 1975 to B. Agusta et al. This patent recognizes and overcomes one of the basic difficulties of conflicting requirements of a combined CTD element and a field effect transistor (FET) on a single substrate, that is, that the CTD element requires diffused regions having resistivity as high as possible, such as greater than 10 ohm centimeters or higher, while the resistivity of the FET diffused regions, particularly the channel region, must be considerably lower than 10 ohm-centimeters.

To obtain the required different resistivities for the two devices, a serial diffusion process is used in Canadian Pat. No. 976,661, whereby the CTD element is masked and subsequently doped in a series of operations entirely separate from the masking and doping series of operations for the FET element. Indeed, this process requires the etching of up to 7 layers, which is expensive and subject to error.

While the aforenoted Canadian Pat. No. 976,661 describes the fabrication of a single type of FET device with a CTD element, complications arise in the manufacture of the CMOS devices, that is, both N and P channel FET devices with CTD elements on the same substrate. Firstly, both N and P channel MOS devices must be manufactured with the active regions of the CTD element and of the N and P channel MOS devices having different resistivities. Yet the operating voltages of all the devices should be the same, typically 10 volts. To achieve these requirements it is preferable to fabricate the charge transfer electrodes of the CTD element and the gates of the CMOS devices at the same time to match their characteristics as closely as possible. Simultaneous fabrication is not obtained in the aforenoted Canadian Pat. No. 976,661, since the devices are made in sequence.

SUMMARY OF THE INVENTION

In the present invention, the active regions, gates and first charge transfer electrodes of the CTD element and of the required CMOS devices are fabricated simultaneously, and thus their operating threshold voltages are the same. Formation of the N and P CMOS devices is considerably simplified with the prior formation of P and N channel substrates (the process of Canadian Pat. No. 976,661 uses only a single type of substrate).

Because of the small output charge available from the CTD element, all junctions on the substrate should have low current leakage to the substrate. Parasitic capacitances should be reduced to the smallest possible since they degrade the capacitively sensed output charge obtained from the CTD element. The present invention utilizes a buried oxide to isolate the devices and thus obtain desirable low leakage and small parasitic capacitance. At the same time it obtains the matched characteristics noted earlier, since the elements are manufactured at the same time as noted above and the gate oxide thickness is the same for both types of devices. Since the self aligning fabrication process is used, a high packing density is achieved.

Further, a substantial number of the fabrication steps which would be required with sequential fabrication of each element are eliminated, resulting in reduced cost of manufacture, and greater yield of working devices. Only up to 3 layers need be etched, as opposed to up to 7 in the process of Canadian Pat. No. 976,661.

As a resulting product of the disclosed inventive process, it is believed that for the first time a CTD element has been combined on the same substrate with CMOS FET devices.

In general, the invention is a method of fabricating a semiconductor device comprising providing a semiconductor substrate of one impurity polarity type, having a silicon nitride mask over its upper surface for defining field effect device channel regions and charge transfer device charge storage regions, and a photoresist mask which is open over predetermined portions of the silicon nitride mask and the substrate surface for defining field effect device and charge coupled device regions, applying a low dosage high energy implantation of opposite type impurity into regions of the substrate not covered by the photoresist mask, and applying a high dosage low energy implantation of said opposite type impurity into regions of the substrate not covered by both of said masks.

Accordingly since the impurities imparted by the different energies of implantation and dosages are masked to different degrees by two different kinds of masks, including one overlying the other, the various resistivities which are required for the substrate of various elements on the same chip are obtained without the serial masking and doping steps which would be required following the process described in the aforenoted Canadian Pat. No. 976,661. The low dosage implantation provides high resistivity diffused regions and the high dosage implantation provides low resistivity diffused regions.

As a result, a novel integrated circuit can be fabricated comprising a P channel CMOS transistor, an N channel CMOS transistor, and a charge transfer device, in which both the transistors and the charge transfer device are integrated into a single substrate.

More generally, the inventive method of fabricating devices having different substrate resistivities comprises providing a semiconductor substrate, applying a silicon nitride mask over first predetermined regions of the substrate, applying a photoresist mask over second predetermined regions of the substrate, some of which may overlap or cover certain of the first predetermined regions, applying a low dosage of an impurity with high energy to the surface of the substrate, so as to cause the impurity to penetrate into the surface of the substrate through the silicon nitride mask and through the exposed surface but not through the photoresist mask, and applying a high dosage of an impurity with low energy to the surface of the substrate so as to cause the latter impurity to penetrate into the surface of the substrate only through the exposed surface of the substrate, but not through the silicon nitride or photoresist masks.

INTRODUCTION TO THE DRAWINGS

A better understanding of the invention will be obtained by reference to the detailed description below, and to the following drawings, in which:

FIGS. 1–8 are cross-sectional views of a semiconductor substrate and surface layers thereon, in sequence of manufacture of a combination of CTD and CMOS devices, with the dimensions exaggerated for clarity of understanding.

DESCRIPTION OF THE PREFERRED EMBODIMENT

The process for manufacturing self-aligned MOS devices is well known to those skilled in the art, and therefore will not be described in detail. Further, the structure of charge coupled devices is also well known, and is described in, for example, Canadian Pat. No. 969,287 issued June 10, 1975 to W. F. Kosonocky, Canadian Pat. No. 957,781 issued Nov. 12, 1974 to W. E. Engeler et al, Canadian Pat. No. 1,027,672 dated Mar. 7, 1978 to M. P. Anthony et al, Canadian Pat. No. 971,287 to R. H. Walden, ect.

Figure 1:
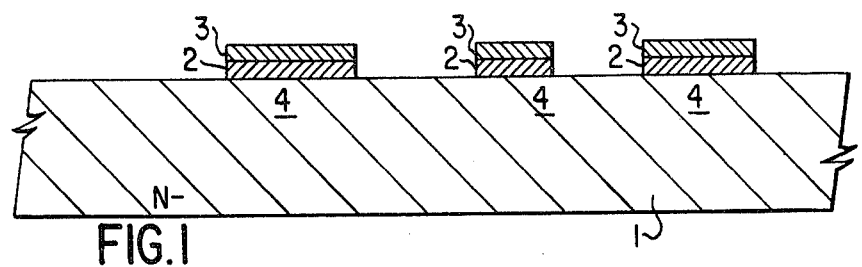

Turning to FIG. 1, a high resistivity $N^-$ impurity doped silicon substrate 1 has been treated as, for example, by doping with phosphorus. Other kinds of substrates such as silicon on sapphire could also be used. The thickness of the substrate preferably should be about 500 microns, and the impurity concentration should be about $10^{15}$ impurities per cubic centimeter.

The doped substrate should then be oxidized to form a layer 2 of silicon dioxide typically of about 500 Angstroms, on top of which a layer of silicon nitride 3 should be deposited, which layers should be defined using well known techniques, to overly the FET and CTD devices as shown.

While both N and P channel FET devices are fabricated on the same substrate according to the present invention, an N channel CTD element can now be fabricated combined with the noted FET devices on the same substrate, (or can be fabricated alone according to the subject methods). It will be understood, however, that while N channel CTD devices are preferred, opposite conductivity channel type CTD devices can be fabricated. The double implant procedure to be described herein can be used to minimize edge leakage currents in structures such as silicon on sapphire where leakage between devices is not a problem.

Figure 2:
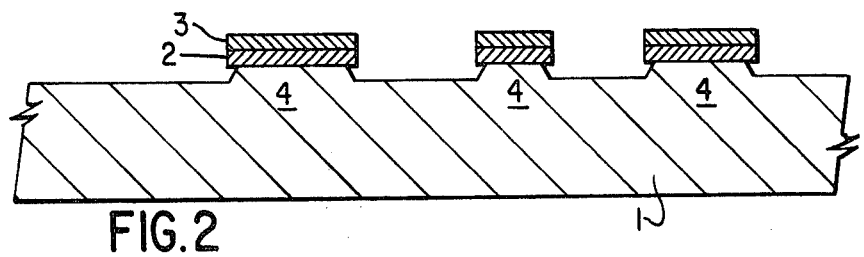

It was found that the impurities to be implanted in certain of the following steps undergo some sideways diffusion within the substrate, which can influence the characteristics of the FET device area masked by the silicon nitride gate region layer. To reduce this effect an etching step is next preferably carried out, using the silicon nitride layer and silicon dioxide as a mask. The etchant used can be nitric acid plus hydroflouric acid, applied for 0.5 minutes. As a result the exposed surface of the silicon as well as a portion thereof under the silicon nitride and silicon dioxide layers at the edges of the gate region 4 of the N channel FET device is etched away, resulting in a surface profile as shown in FIG. 2.

Since the etchant etches partly under the silicon dioxide, a sloping edge is formed thereunder, which edge is masked by the silicon nitride against the ion implanted impurities in a high impurity dosage, low implantation energy substrate doping step to follow. The heavily implanted impurities therefore will have to diffuse upward toward the sloped edge, which edge oxidizes rapidly, thus limiting the impurity concentration in that region. This effectively minimizes effects on the devices which result from high dosage ion implantation. The silicon is also etched in the region to become the $P^-$ channel device, but has no deleterious or advantageous effects.

Figure 3:
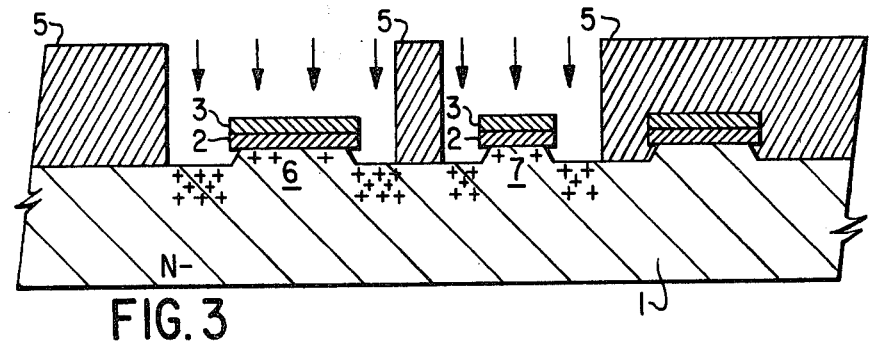

A photoresist layer 5 such as HR200 available from Hunt Chemicals is deposited as a mask over the substrate and its upper layers for defining active regions of the N channel FET and the CTD devices where the diffusion wells are to be formed, as shown in FIG. 3. The thickness of the photoresist should be at least 6000 Angstroms. The active regions of the CTD device and channel FET which are to be doped are indicated by reference numerals 6 and 7 respectively. The silicon substrate in which the P channel CMOS device will be made is covered by the photoresist layer 5.

The formation of the $P^-$ type wells is shown in FIG. 3. The photoresist layer 5 should overlap the boundaries of the silicon dioxide and silicon nitride insulators 2 and 3 in order to allow for implantation of the P type impurity directly into the silicon.

A low dosage, high energy ion implantation of a P type impurity such as boron is applied to the upper surface of the semiconductor substrate. The boron ions pass through the silicon nitride and silicon dioxide layers exposed by the photoresist layer but are stopped by the photoresist layer, and form $P^-$ type wells which define the active regions of the N channel CMOS FET and the CTD devices. Due to the low dosage, the $P^-$ type wells in the $N^-$ substrate have high resistivity. Typically the dosage of the ion implantation should be about $5 \times 10^{12}/cm^2$ and the energy of the implantation should be 100 Kev.

As a result the threshold voltage of the resulting N channel and CTD devices will be low, and similar to each other.

High boron impurity concentration in the field regions of the N channel FET is desireable to establish a high field threshold voltage, and thus a second ion implantation step is implemented using the same masks as in the earlier implantation step. The second ion implantation of boron impurity is effected with high dosage and low energy. Preferably the dosage of the ion implantation should be greater than $10^{13}$ and the energy of the implantation should be smaller than 40 Kev.

In this case the silicon nitride layer both over the active CTD region 6 exposed by the photoresist, and at the gate 7 of the N channel CMOS FET shields the substrate from the boron implantation. All those regions masked by photoresist layer 5 are also shielded from the impurity. This results in more highly doped, lower resistivity field regions (demarcated by a higher density of + signs in the P well 10). The higher resistivity regions form the channel regions of the N channel field effect devices and the N$^-$ channel CTD devices which require higher resistivity, to achieve low threshold voltage.

With the above steps the P$^-$ doped substrate for both the CTD devices and FET devices are formed using the same masks, yet achieve high resistivity where required and low resistivity where required. A substantial number of processing steps which would have been previously required using serial substrate doping fabrication techniques have been eliminated, and the devices are rendered electrically compatible due to their presence in the same substrate and simultaneous initial doping.

Figure 4:
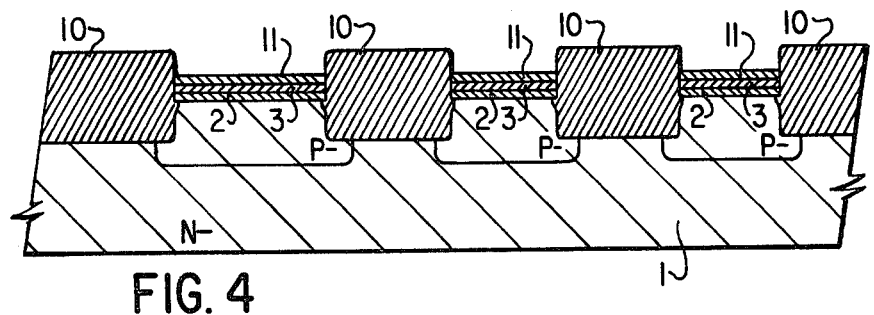

The photoresist is then removed, and the silicon dioxide 2 and silicon nitride 3 layers are used as a mask. The exposed silicon is oxidized to a thickness typically 1.5 m, shown as silicon dioxide layer 10 in FIG. 4. A thin silicon dioxide layer 11 is grown over the silicon nitride layer 3. The layer 2, 3 and 11 are then etched away, leaving the layer 10, af about 1.3 m, remaining on the wafer.

Figure 5:
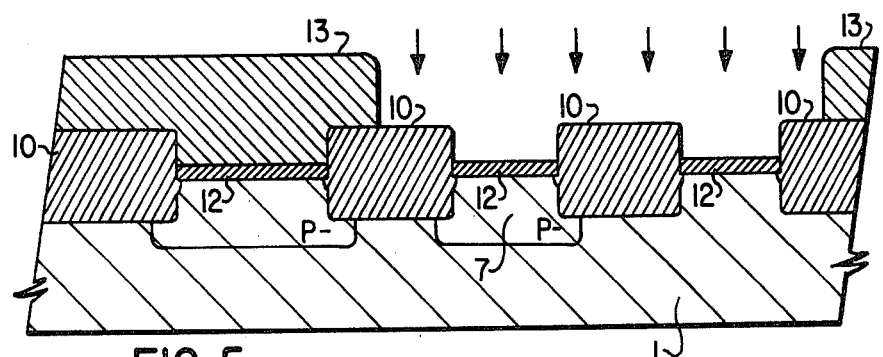

A layer of silicon dioxide 12 is now grouwn on the exposed silicon regions, as shown in FIG. 5. A photoresist layer 13 is then deposited, and is defined to expose the gate region for the P$^-$ channel devices. Boron impurity is then implanted (shown with the vertical arrows) with a typical does of $2 \times 10''/a^2$ and an energy of 40 Kv to lower the P$^-$ channel FET threshold voltage. Should it be desired to increase the N channel FET threshold voltage, boron implantation can be provided for the devices by defining openings in the photoresist over the gate region 7, at the same time, as shown in FIG. 5. The surface resistivity of the N channel FET device would then be equivalent to typically 2 ohm cm. for bulk silicon.

Figure 6:
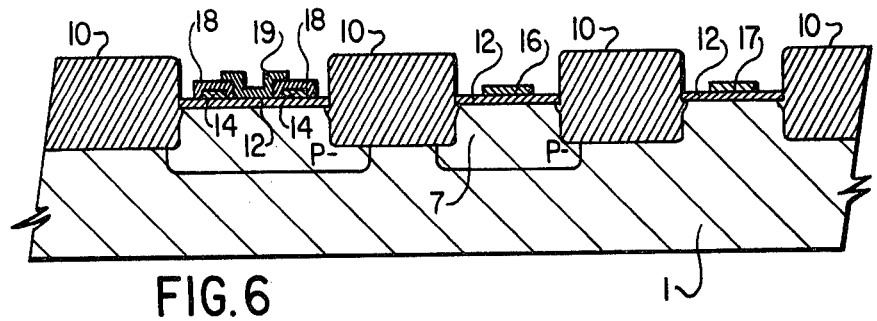

A first layer of polysilicon is then deposited and defined as shown in FIG. 6, to form first level gates 14 for the CTD, gate 16 for the N channel FETs and gates 17 for the P channel FETs.

An oxide layer 18 is then grown over the first polysilicon layer in the CTD gate region, typically about 600 Angstrom units in thickness. A second layer of polysilicon is then grown over the oxide layer and defined by etching to form a second electrode 19 for the CTD, insulated from the first level gates by the oxide layer 18. The second polysilicon layer can also form a gate electrode for the P and N channel FET device, if required. The latter is not shown in FIG. 6 and is optional.

A capacitor can be formed using layers 14 and 19 as the electrodes if layer 14 is doped to make it conductive prior to growth of the silicon dioxide layer. When the silicon dioxide insulating layer 18 is grown, a similar layer 18 is grown as a dielectric on the surface of the capacitor lower electrode 18. When the second transfer electrode 19 is formed for the charge transfer device as shown in FIG. 6, the upper electrode 19 of the capacitor is formed.

Figure 7:
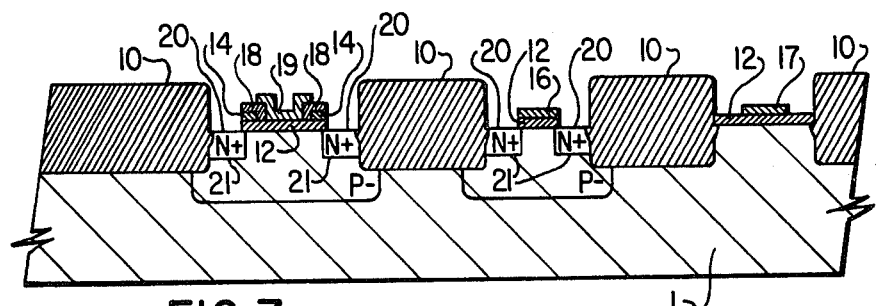

Silicon dioxide layer 12 is now etched in the source and drain regions 20 of the N channel FET and CTD devices, as shown in FIG. 7, through a photoresist mask, to expose the surface of the substrate 20 where N$^+$ doping impurities are to be introduced, whereby the substrate will be doped N$^+$. An impurity such as phosphorus is diffused or implanted into the exposed surfaces, to form the N$^+$ doped regions 21.

At the same time, all the polysilicon regions which are exposed, i.e. the gates of the N and P channel field effect transistors 16 and 17 and the second transfer electrodes 19 of the CTD device, are similarly doped N$^+$, rendering them conductive.

Figure 8:
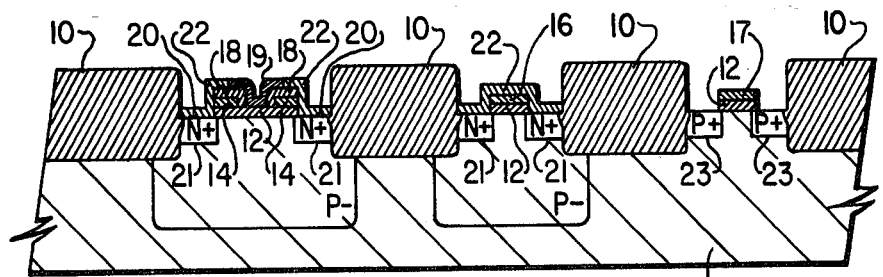

The regions to be doped P$^+$ at the surface of the substrate where the P channel devices are to formed are exposed by etching the silicon dioxide layer 12. Diffusion or implantation of boron impurities into the surface of the N$^-$ doped silicon substrate causes formation of the P$^+$ doped regions 23, as shown in FIG. 8.

It should be noted that the N$^+$ doped polysilicon and the N$^+$ diffused regions may be left exposed to the boron diffusion or ion implantation source. While the boron thus partly compensates the N$^+$ doped regions, due to the relative concentrations of the dopant and due to the growth of oxide 22 on the surface of the substrate during the N$^+$ diffusion, the N$^+$ doped regions are only partly compensated, and are left effectively N$^+$.

In the alternative, the N and the P type diffusions can be performed sequentially, without using the partially compensating step noted above.

The surface is then etched through a photoresist mask to expose the regions to which conductive contacts are to be made (not shown). These include the source, drain and gate regions of the N channel and P channel MOS devices, the upper and lower electrodes of the capacitor, the source and drain of the CTD device as well as the first and second layer transfer electrodes thereof. Deposit of an aluminum layer defines the conductive paths and makes contact to the contact regions, thereby completing the structure. Of course other compatible conductive materials than aluminum can be used.

As a result of the aforenoted steps, and particularly the steps by which the P$^+$ regions of both the the charge transfer device and the N channel device are formed in the substrate at the same time, but with different substrate regions having different resistivities, for the first time a combination CMOS and charge transfer array circuit can be fabricated in the same substrate, which CMOS devices include both N and P channel field effect transistors.

A person skilled in the art understanding this invention would now be able to fabricate other types of devices having different field thresholds and different substrate resistivities with efficiency using one masking step to facilitate doping with different dosages and intensities of ion implantation.

With the novel principles described above, one may vary the particular sequence of steps or masking arrangements to provide other useful devices. For instance where a diffused layer is to be provided under the first or second layer of polysilicon, a polysilicon to N$^+$ doped silicon charge storage capacitor may be formed to fabricate a bucket brigade type of charge transfer device.

Other variations and embodiments may also become evident to a person skilled in the art understanding this invention. All are considered within the sphere and scope of the present invention as defined in the appended claims.

I claim:

1. A method of fabricating a semiconductor device comprising:

(a) providing a semiconductor substrate containing one impurity polarity type, having a silicon nitride mask over its upper surface for defining field effect device channel regions and charge transfer device storage regions, and a photoresist mask which is open over predetermined portions of the silicon nitride mask and the substrate surface for defining field effect device and charge transfer device regions of similar polarity type, which is opposite to said one polarity type, (b) applying a low dosage high energy implantation of opposite polarity type impurity into regions of the substrate not covered by the photoresist mask sufficient to form high resistivity regions of the field effect and charge transfer devices, and using the same said masks (c) applying a high dosage low energy implantation of said opposite type impurity into regions of the substrate not covered by both said masks sufficient to form low resistivity regions of the field effect and charge transfer devices.

2. A method of fabricating a semiconductor device comprising:

(a) providing a semiconductor substrate containing one impurity polarity type, haing a silicon nitride mask over its upper surface for defining field effect device channel regions and charge transfer device storage regions, and a photoresist mask which is open over predetermined portions of the silicon nitride mask and the substrate surface for defining N channel field effect device and charge transfer device regions of similar polarity type, which is opposite to said one polarity type, (b) applying a low dosage high energy implantation of opposite polarity type impurity into regions of the substrate note covered by the photoresist mask sufficient to form field effect device channel regions and charge transfer device storage regions, and using the same said masks (c) applying a high dosage low energy implantation of said opposite type impurity into regions of the substrate not covered by both said masks sufficient to form said regions of similar polarity type having low resistivity.

3. A method as defined in claim 2, in which the semiconductor substrate is $N^-$ doped, and the impurities which are implanted in step (b) provide P type doped regions in the substrate.

4. A method as defined in claim 3 including the step of etching the surface of the semiconductor substrate not covered by the silicon nitride mask, as well as regions under the adjacent peripheries of the silicon nitride mask.

5. A method as defined in claim 3 in which the P impurity implantation step is carried out by ion implantation of boron.

6. A method as defined in claim 1, 2 or 3, in which the photoresist mask is open over predetermined portions of the silicon nitride mask and the substrate surface for also defining parasitic N channel field effect device regions where field effect transistor action must be suppressed.

7. A method of fabricating a semiconductor device comprising (a) providing a semiconductor substrate, (b) applying a silicon nitride mask over first predetermined regions of the substrate, (c) applying a photoresist mask over second predetermined regions of the substrate, some of which may overlap or cover certain of the first predetermined regions, (d) applying a low dosage of an impurity with high energy to the surface of the substrate, so as to cause the impurity to penetrate into the surface of the substrate through the silicon nitride mask and through the exposed surface but not through the photoresist mask sufficient to form high resistivity regions of the semiconductor device, and using the same said masks (e) applying a high dosage of an impurity with low energy to the surface of the substrate so as to cause the latter impurity to penetrate into the surface of the substrate only through the exposed surface of the substrate, but not through the silicon nitride or photoresist mask, sufficient to form low resistivity regions of the semiconductor device.

8. A method of fabricating a semiconductor device comprising:

(a) providing a $N^-$ doped semiconductor substrate having a silicon dioxide covered by silicon nitride mask over its upper surface for defining N and P channel FET channel regions and N channel charge transfer device storage regions, and a photoresist mask over predetermined portions of the silicon nitride mask and the substrate surface having openings for defining N channel field effect and charge coupled device regions, (b) applying a low dosage high energy implantation of P type impurity into regions of the substrate not covered by the photoresist mask sufficient to form the active regions of the N channel field effect and charge coupled device, (c) using the same said masks, applying a high dosage low energy implantation of $P^+$ type impurity into regions of the substrate not covered by both said masks, sufficient to form N channel field effect device and charge coupled device channel regions, (d) removing the silicon nitride mask, (e) growing a gate oxide layer, (f) depositing a polysilicon layer over the gate oxide layer, (g) etching the polysilicon layer to form first level electrodes of the charge transfer device, and a gate for an N channel field effect device, (h) growing a silicon dioxide second transfer electrode insulating layer over the polysilicon layer and the surface which is exposed between the first transfer electrodes, (i) depositing a second polysilicon layer over the silicon dioxide second transfer electrode insulating layer, for defining second transfer electrodes of the charge transfer device, (j) etching the silicon dioxide to expose surface regions of the substrate for impurity diffusion and formation of N type diffused regions for the $N^+$ channel field effect device and the charge transfer device, (k) diffusing an N type impurity into the exposed surface regions of the substrate to form N type diffusion regions in the N channel field effect and CTD devices, and into said polysilicon gate and second polysilicon layer, (l) etching the silicon dioxide to define surface regions of the substrate for impurity diffusion and formation of P+ type diffused regions for the P channel field effect device, (m) diffusing a P type impurity into the exposed surface regions of the substrate, to form P+ type diffusion regions of the P channel field device device, (n) etching the surface to define contact areas to the predetermined portions of the N and P channel field effect devices and charge transfer devices, (o) applying a conductive layer to the exposed surface, and, (p) etching the conductive layer to define interconnective circuit conductors and contacts for the semiconductor device.

9. A method as defined in claim 8 including the step of etching the surface of the semiconductor substrate not covered by the silicon nitride mask prior to the first doping step by the N+ type impurity, including etching of regions under adjacent peripheries of the silicon nitride mask.

10. A method as defined in claim 8 in which the P+ impurity diffusion step is carried out by ion implantation of boron, the concentration of which is adjusted to only partly compensate N+ doped regions into which it is diffused.

11. A method of fabricating a semiconductor device comprising:

(a) masking first regions of the surface of a semiconductor substrate with an impurity mask which is opaque to a first predetermined impurity implantation energy, (b) masking other regions of said surface with an impurity mask which is opaque to a second predetermined implantation energy which is lower than said first implantation energy, (c) applying said impurity to the masked substrate surface with implantation energy which is
  (a) lower than said second implantation energy and with a first impurity dosage,
  (b) higher than said second implantation energy but lower than said first implantation energy with a second impurity dosage, whereby substantially no impurities penetrate said first regions of the surface, impurities of said second dosage penetrate said other regions of the surface and regions not masked, and impurities of said first dosage penetrate only those regions not masked.

12. A method of fabricating a semiconductor device comprising:

(a) providing a semiconductor substrate, (b) applying a silicon nitride mask over first predetermined regions of the substrate, (c) applying a photoresist mask over second predetermined regions of the substrate, some of which may overlap or cover certain of the first predetermined regions, (d) ion implanting an impurity with a dosage of approximately $5 \times 10^{12}/cm^2$ and an energy of about 100 Kev. to the surface of the substrate so as to cause the impurity to penetrate into the surface of the substrate through the silicon nitride mask and through the exposed surface but not through the photoresist mask to form high resistivity regions of the semiconductor device, and using the same masks (e) applying an impurity with a dosage greater than $10^{13}/cm^2$ and an energy less than 40 Kev. to the surface of the substrate so as to cause the latter impurity to penetrate into the surface of the substrate only through the exposed surface of the substrate, and not through the silicon nitride or photoresist mask to form low resistivity regions of the semiconductor device.

13. A method of fabricating a semiconductor device as defined in claim 8 or 11 in which the first impurity is ion implanted with a dosage of about $5 \times 10^{12}/cm^2$ and an energy of about 100 Kev., and the second impurity is ion implanted with a dosage greater than $10^{13}/cm^2$ and an energy less than 40 Kev.

* * * * *